Oct. 22, 1963 C. H. KNOWLES 3,108,209
TRANSISTOR DEVICE AND METHOD OF MANUFACTURE
Filed May 21, 1959 3 Sheets-Sheet 1

ACTUAL SIZE

INVENTOR.
Carl H. Knowles
BY Mueller & Aichele
Attys.

Oct. 22, 1963 C. H. KNOWLES 3,108,209

TRANSISTOR DEVICE AND METHOD OF MANUFACTURE

Filed May 21, 1959 3 Sheets-Sheet 2

INVENTOR.
Carl H. Knowles
BY Mueller & Aichele
Attys.

Oct. 22, 1963 C. H. KNOWLES 3,108,209

TRANSISTOR DEVICE AND METHOD OF MANUFACTURE

Filed May 21, 1959 3 Sheets-Sheet 3

INVENTOR.
Carl H. Knowles
BY Mueller & Aichele
Att'ys.

United States Patent Office 3,108,209

Patented Oct. 22, 1963

3,108,209
TRANSISTOR DEVICE AND METHOD OF MANUFACTURE

Carl H. Knowles, Scottsdale, Ariz., assignor to Motorola, Inc., Chicago, Ill., a corporation of Illinois Filed May 21, 1959, Ser. No. 814,745
8 Claims. (Cl. 317—234)

This invention relates to high frequency transistors and methods of manufacturing the same. More particularly, the invention relates to a diminutive diffused base transistor having both improved frequency and high power handling capabilities and of a rugged and reproducible configuration, as well as to a manufacturing process for the assembly of such units on an economical mass production basis.

Known high frequency transistors have included a semi-conductor die with a thin base region interposed between collector and emitter junctions associated with electrodes on opposite faces of the semiconductor die. In certain applications of an additional region of high resistivity or intrinsic semiconductor material provides a depletion layer between the base region and the collector junction. Proper balancing of the dimensions and properties of the various layers and regions requires that the transistor structure and methods of manufacture be susceptible to extremely accurate control. Achieving the desired degree of control over these characteristics has been a major problem in the production of high frequency transistors on a commercially practical basis.

The size of transistors generally decreases as the high frequency range is extended, and the high frequency devices being considered are so tiny that serious practical manufacturing problems arise in assembling them. The difficulty of handling, positioning, and working on the miniature and micro-miniature components and sub-assemblies involved is tremendous, particularly in view of the extremely tight control which must be maintained on dimensions and positions of the various parts as previously mentioned. Moreover, it is desirable that these high frequency transistors be rugged and capable of relatively high power operation despite their diminutive size.

It is an object of the present invention to provide a high frequency transistor characterized by a high degree of reliability of performance while operating at very high frequencies and which is economically manufacturable by mass production techniques.

It is a further objpect of the invention to provide a diminutive transistor whose structure is such as to make it successfully operative at high frequencies and also to provide effective heat resistance and heat dissipation to make it more useful in higher power ranges than other high frequency transistors.

It is a still further object of the invention to provide economical and efficient methods of manufacturing high frequency transistors with close dimensional control over the various parts of the unit so that they are sufficiently uniform, both structurally and electrically, to be commercially practical.

A feature of the invention is the provision of a high frequency transistor including an extrinsic semiconductor body having a diffused surface layer of one conductivity type providing a base region, and a substrate layer of opposite conductivity type providing a collector region, with the surface layer having a channel or depression therein which isolates an active base portion and an active collector junction of small predetermined area, and with the configuration of the channel, and therefore the dimensions of the active portions of the body, being accurately controllable so as to facilitate making the transistors with a high degree of electrical and structural uniformity and with high yields.

Another feature of the invention is the provision of a high frequency transistor having a relatively large area collector region secured to a heat sink providing effective heat dissipation and in which the metals and alloys in the structure have relatively high heat resistance, thereby permitting use of the device in power dissipating applications. The lowest melting temperature of any part of the final structure is high enough to permit the device to be baked for cleaning purposes in a vacuum at an elevated temperature of up to 350° C., thereby substantially increasing the reliability of the device's performance.

Another feature is the provision of a high frequency transistor device wherein interelectrode capacitance is minimized by a metal body extending between and insulated from the emitter, base, and collector leads of the device, with the metal body being connected to a ground lead, thereby providing a shield which reduces feedback capacitance and extends the frequency response of the transistor.

Figure 2:
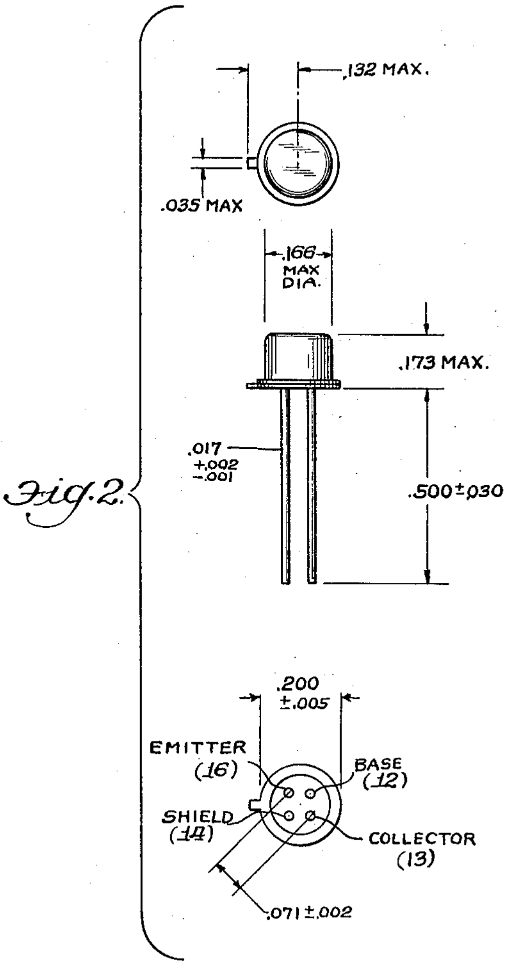
FIG. 2 is a collective illustration of the transistor including top, side, and bottom views with the actual dimensions of one commercial embodiment of the invention applied thereto, but greatly enlarged in the illustration.
Figure 2A:
Figure 3:
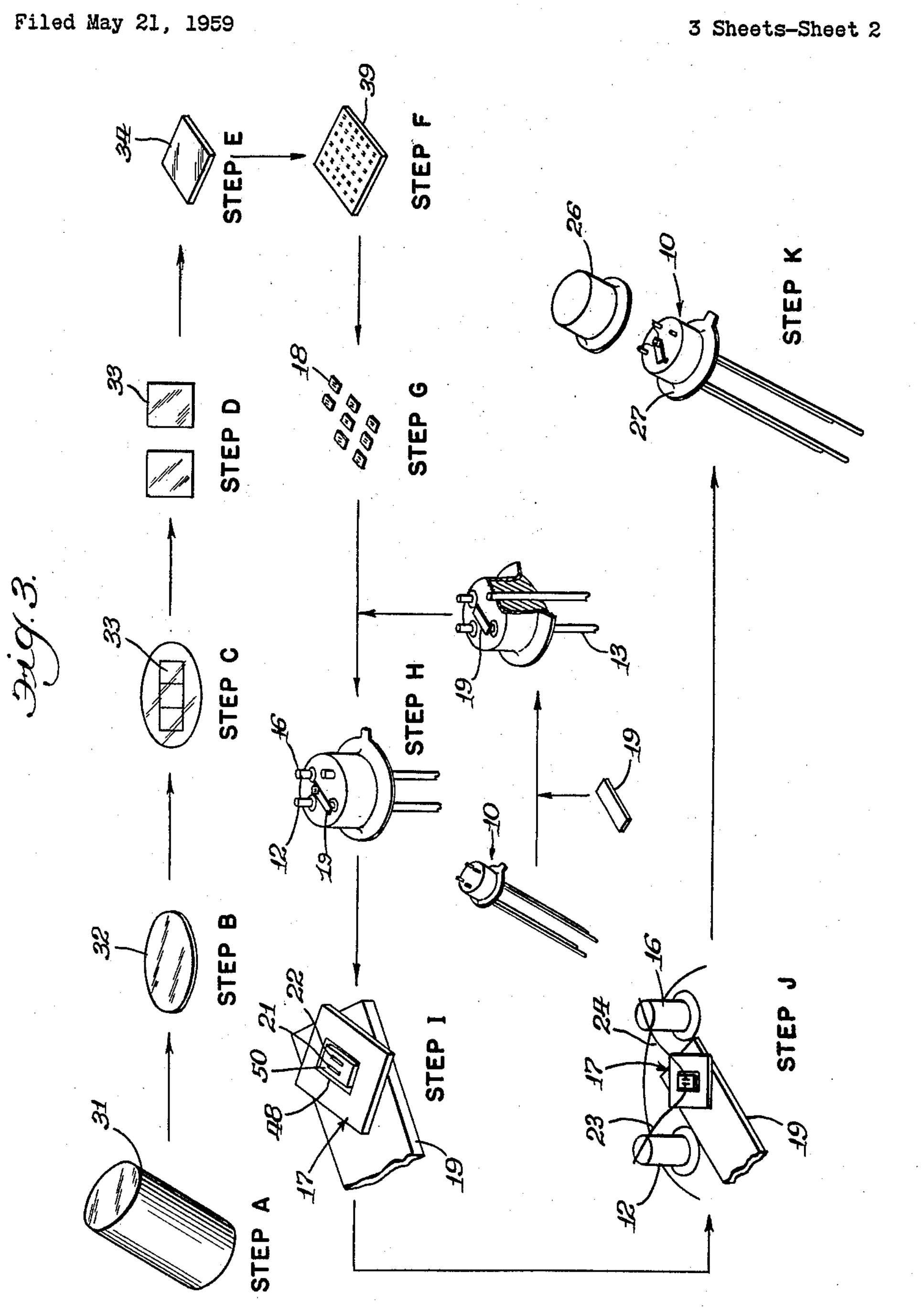
Figure 4:
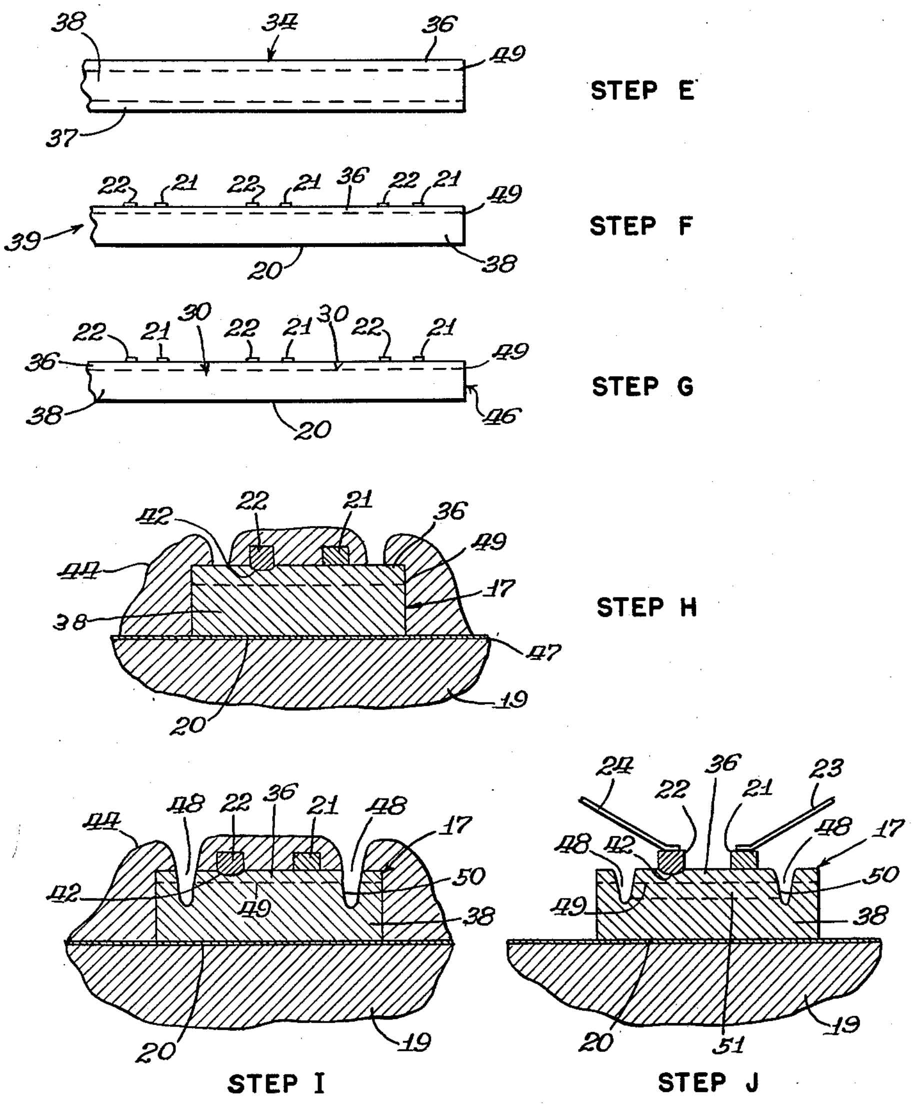

FIG. 2*a* is a view illustrating the actual size of a typical transistor of the invention, corresponding to the dimensions of FIG. 2;

FIG. 3 is a flow sheet illustrating in diagrammatic form the various steps of the assembly process in accordance with the invention; and FIG. 4 is a flow sheet illustrating the configuration of the semiconductor die unit of the transistor at various stages in its fabrication.

The high frequency transistor of the present invention includes a semiconductor body having a diffused surface layer of one conductivity type and a substrate layer of the opposite conductivity type providing a rectifying junction therebetween. A base electrode and an emitter junction and electrode are formed by evaporation and alloying of metals on the surface layer. A channel or depression extending through the surface layer into the substrate layer surrounds the area immediately adjacent the base and emitter electrodes, much like a moat around an island, and isolates an active collector junction of a small predetermined area. The substrate of the die provides a relatively large area collector region of high resistivity, and this is mounted on and secured to a molybdenum tab which serves as a heat sink, and which in turn is secured ot the collector lead or post of a mounting header. Extremely fine wires are bonded to the base and to the emitter electrodes by thermo-compression techniques, and these wires are connected to corresponding posts of the header by the same techniques.

Figure 1:
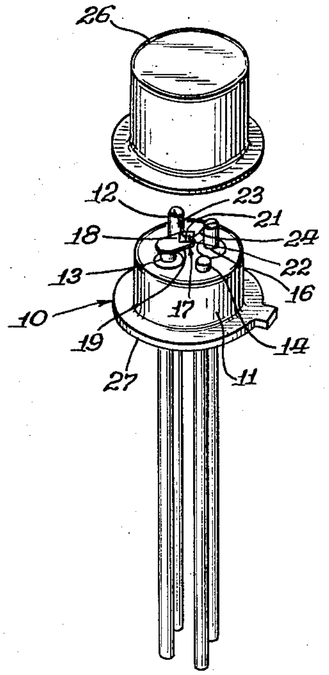
FIG. 1 is a perspective view of the transistor of the present invention greatly enlarged for illustrative purposes and showing the outer cover thereof removed.

FIG. 1 of the accompanying drawings, which is on a greatly exaggerated scale for purposes of clarity, illustrates a transistor in accordance with the present invention. This unit includes a mounting header, generally indicated as 10, having a body of insulating material surrounded by a metallic inner cover portion 11 with conductive posts 12, 13, 14 and 16 thereon. A semiconductor die unit indicated generally as 17 and including a die 18 of germanium is mounted with one surface on a molybdenum heat sink tab 19 which in turn is secured to the collector post 13. The die 18 has a base electrode 21 and an emitter electrode 22 deposited on its face by evaporation, and these are respectively connected to posts 12 and 16 by thin contact wires 23 and 24. An outer cover or can member 26 is welded to the lip or flange 27 of the inner cover 11 to enclose the electrically active portion of the unit.

The posts 12, 13, 14 and 16 are spaced equidistantly on a circle, and the semiconductor die unit 17 is located at the center of this circle. Posts 12, 13 and 16 extend through the header 10 and provide leads respectively for the base, collector, and emitter of the transistor. These leads or posts are insulated from the metallic cover 11 by glass rings mounted in the cover and through which the leads extend. The other lead 14 is welded or otherwise directly connected to the metallic cover 11 and is the ground or shield lead of the transistor. The cover 11 provides a conductive body which extends between each of the leads and therefore acts as a shield which minimizes interelectrode capacitance. More particularly, the shielding reduces the collector to base capacitance and collector to emitter capacitance and thereby eliminates undesirable feedback.

The final product has the appearance shown in FIG. 2*a* which is the actual size of a typical transistor made in accordance with the present invention. The dimensions of one commercial embodiment of the invention are shown in the illustration of FIG. 2. From the scale of FIG. 2*a* and the dimensions of FIG. 2, it will be readily appreciated that the assembly of a device of such minute size poses a great many practical manufacturing problems. In order that the transistor have a suitable high frequency response and be reliable and consistent in performance, the positioning and dimensions of the various conductivity regions within the die unit 17 and of the electrodes and connections thereto must be controlled within minute tolerances. Moreover, all of this must be accomplished in a highly reproducible manner with a minimum danger of contamination and on an economical basis.

FIG. 3 illustrates diagrammatically the various steps employed in practicing the assembly method of the present invention. The starting material for the semiconductor die is a single crystal ingot 31 (Step A) of germanium of P-type conductivity, having a resistivity between .15 and 3 ohm centimeters, and preferably about 1 ohm centimeter. Such a body may be prepared by standard techniques such as zone-leveling which form no part of the present invention. Although the present invention may by applied to silicon semiconductors, is is preferred to use germanium for high frequency applications because of the relatively greater mobility of holes and electrons within germanium. The ingot 31 is cut into individual slices of a thickness of about 0.015 inch and these are lapped to form slices such as 32 of a thickness of 0.010 inch (Step B). The germanium slice 32 is then etched on both surfaces to a thickness of 0.006 inch and is polished on one surface to further reduce its thickness to about 0.004 inch (Step C). This slice is cut into wafers or slabs 33 about 0.375 inch square. The wafers 33 are etched in a solution of nitric and hydrofluoric acid to a thickness of about 0.003 inch to remove material damaged by the polishing. The etched wafers are cleaned with a boiling 5 percent potassium cyanide solution to remove any stray metallic substances, and are washed in water (Step D).

A plurality of these cleaned wafers are subjected to a diffusion treatment (Step E) in order to form a surface layer of graded resistivity which will eventually serve as the base of the completed transistor. Diffusion is accomplished by contacting the P-type wafers 33 with a vapor of donor-type impurity such as antimony. The impurity penetrates the opposite surfaces of the P-type wafers by diffusion, forming thin layers of germanium doped to the opposite or N-type of conductivity. Since the concentration of the diffused impurities is highest at the surface of the wafer, the resistivity of these diffused layers is graded from a relatively low value immediately adjacent the surface to a relatively high value toward the interior. Because the diffused layer and the substrate are of opposite conductivity types, a rectifying junction is formed therebetween. The diffusion is carried out in an atmosphere of hydrogen and antimony in an oven at a temperature of about 650° C. (Step E), to produce the diffused wafers 34. The time required for diffusion is one hour.

The configuration of a typical diffused wafer 34 is shown in Step E of FIG. 4. As indicated by the dotted lines, it consists of diffused N-type surface layers 36 and 37 separated by a substrate 38 of P-type germanium. The thickness of the diffused surface layer 36 controls the thickness of the base region of the completed transistor, and this layer should be very thin in order to obtain desirable high frequency response. A typical thickness obtainable by diffusion techniques for layer 36 is about 10,000 Angstrom units. The diffusion process is susceptible to very precise control, so the rectifying junction 49 between layer 36 and substrate 38 can be located very accurately. The diffusion process must be clean, and extreme care is exercised to maintain cleanliness with the result that uniformity of the end product is good and yields are high.

The layer 37 is removed by etching, and the diffused wafer 34 is then treated (Step F) to deposit a plurality of closely spaced pairs of electrodes, each including an emitter electrode 22 and a base electrode 21, on the surface layer 36. This is accomplished by placing the wafer 34 in a vacuum evaporator system, placing a nickel mask having a pattern of slits formed therein in closely spaced relation with the surface 36, and evaporating metal from filaments and depositing it on the portions of surface 36 exposed by the slits. Two filaments are provided in different positions with respect to the slits so that metal evaporated from one filament passes through the slits angularly and condenses on the wafer forming the emitter stripes, and metal evaporated from the other filament passes through the slits at a different angle forming the base stripes near but spaced from the emitter stripes. The mask accurately defines the area of each stripe. During this process the other surface of the wafer 34 is maintained on a heated surface. In a typical application 144 pairs of electrode stripes are deposited on a single wafer.

Step F of FIG. 4 is a side view showing several pairs of electrodes deposited on the germanium base, and each pair corresponds to a die unit 17 as shown in FIG. 1. The emitter stripe 22 is of aluminum, and this is deposited to a thickness of about 1800 Angstrom units. This deposition is carried out in the vacuum evaporator in a clean environment with the wafer at a temperature of about 300° C. The wafer is then heated to a temperature of 525° C. and upon cooling a recrystallized alloy region of aluminum and germanium is formed slightly below the upper surface of the wafer. This recrystallized alloy region is heavily doped with aluminum which is an acceptor type impurity, and therefore a PN rectifying emitter junction 42 (see Step H) is formed between the alloy region and the diffused region 36. The re-crystallized germanium and aluminum alloy has a melting point above 350° C.

The base stripe 21 is of gold and silver and provides a nonrectifying ohmic connection to the base layer 36. In the evaporation step F gold is placed on the proper filament and after the aluminum is deposited and alloyed, a very small portion of this gold is evaporated and deposited to a thickness of about 300 Angstrom units on the germanium body which is at a temperature of 300° C. This layer of gold is alloyed by raising the temperature of the wafer to about 420° C. and the wafer is then cooled back to 300° C. Then silver is put on top of the gold remaining on the vaporizing filament, and this silver is all evaporated. Following evaporation of the silver, the remainder of the gold on the filament is evaporated and deposited on top of the silver on the wafer.

Later in the process when the wafer is heated, the alloyed gold and germanium form a melt, and some of the silver dissolves in this and raises the melting point.

Thus, a relatively high temperature alloy region of gold, silver and germanium which melts above 350° C. is formed, and yet there is ample silver and gold remaining on the outer surface to provide the base electrode 21. The gold coating on the outer surface of this electrode prevents formation of "whiskers" on the silver, a well-known phenomenon which would cause difficulty in later process steps if not eliminated.

The back of the wafer is treated (Step F) to provide a high temperature majority carrier contact 20 for the collector region. The N-type layer 37 (see Step E) is removed by etching before the stripes are deposited. After the stripes are made a thin layer of gold, a second layer consisting of gold and indium, and a third layer of gold are applied successively to the back surface by evaporation and deposition. These layers alloy upon heating later in the operation and form a non-injecting collector contact, as will be explained further.

The member 39 is scribed (Step G) along parallel lines as shown by the shallow indentations 30 enlarged in FIG. 4, for illustration, and is broken into individual dies 18 (FIG. 3—Step G) which are typically about 0.025 inch square. The dies are formed so that the electrodes 21 and 22 are approximately centered on the upper surface thereof, and together form a unit which in an incomplete form corresponds to unit 17 of the completed transistor of FIG. 1.

The mounting header 10 has the molybdenum heat sink tab 19 (previously described for FIG. 1) soldered to the end of the post 13, and a die unit 17 is fused to the tab (Step H). One reason molybdenum is selected for the heat sink tab 19 is that its coefficient of thermal expansion is very close to that of germanium. As shown in FIG. 4, Step H, the heat sink tab 19 is provided with a thin layer 47 of gold on one side. A small disc of silver solder such as that sold under the trademark "Incusil" is placed on one end of the heat sink tab 19 on the side opposite the gold film. The heat sink is then heated in an atmosphere of hydrogen to about 700° C. and the solder attaches to the tab. The tab is then placed on the header with the solder down on the collector post 13, and the assembly is heated again to about 700° C. to make the solder connection to the post.

The die unit is put on the heat sink tab 19 with the gold and gold-indium layers on the die facing the gold layer 47 on the tab. The assembly is then heated to about 400° C. in a hydrogen atmosphere, and the gold, indium and germanium all melt together. Upon cooling, the regrowth layer next to the germanium is a majority carrier contact 20 in which injection of minority carriers (electrons) is inhibited by the indium. The alloy contact 20 has a melting point above 350° C., and it has been found that this alloyed gold-indium collector contact is more reliably non-injecting than pure indium. It is during this heating to 400° C. that the germanium, gold and silver of the base connection undergoes the alloying and regrowth which has already been described in connection with Step F. The aluminum and germanium alloy region of the emitter connection has a melting point above 400° C., so the emitter is not substantially affected by the heating to 400° C.

In order that the resulting transistor have satisfactory high frequency response, it is desirable to reduce its collector capacitance. This is done by controlling the area of the collector junction 49 formed between the substrate layer 38 and the surface layer 36. The subassembly with the die unit 17 on the tab 19 attached to the header 10 is treated so as to coat the upper surface of the die with a uniform layer of a protective wax 44 (Step H, FIG. 4). A peripheral path is scribed in the form of a rectangle around the stripes 21 and 22 thereby removing the wax along the path and exposing a very narrow rectangular line on the surface layer.

The coated subassembly is then placed in a flowing stream of electrolyte, and electric current is passed through the die unit 17 in order to etch a channel 48 into the germanium under the line (FIG. 4, Step I). The rectangular channel or depression 48 extends through the surface layer 36 into the substrate 38 as best shown in FIG. 4, and forms an electrically isolated island 50, known as a "mesa," on which the two electrodes 21 and 22 are located and including the active collector junction 49 and the active base region 36. This controls the area of the active collector junction, and therefore controls the collector capacitance of the final transistor product. By keeping the etching electrolyte, which is a very dilute solution of nitric acid in de-ionized water, flowing over the surface, the particles being etched away are immediately removed. This produces a very clean collector junction. Since only a minute area of germanium is removed, the etching is accomplished very quickly. After the channel or depression is etched, the unit is cleaned to remove the wax by means of a spray of carbon tetrachloride.

It is possible to control the area and outline of the island 50 very closely with the method just described because the scribing can be done extremely accurately. For instance, a micromanipulator machine with a pantograph controlled scribing point may be used in the scribing operation. The assembly with the wax covered die is viewed through a microscope, and by operating various controls the point is positioned exactly where the channel is desired. The operator then follows a master of the desired outline with the pantograph, and the scribing point makes the channel outline on the die by removing the wax in its path of movement.

After etching and cleaning, the sub-assembly is heated and gold contact wires 24 and 23 are connected respectively between the emitter electrode 22 and post 12, and between the base electrode 21 and post 16 (Step J). This is done by a thermo-compression technique in which finely concentrated force is applied to the wire pressing it against the electrode with sufficient pressure to cause them to bond together. The wires are also bonded to the posts in the same manner, the posts being made of nickel-iron alloy sold under the trademark "Kovar." The "Kovar" may be provided with a gold plated exterior in order to provide soft metal to which the wires will bond well.

From FIG. 4 it will be seen that the electrically active part of the transistor includes the island portion of the thin diffused surface layer 36 and the island portion of the rectifying junction 49. The island portion of layer 36 is the active base region, and the substrate layer 38 serves as the collector region of the transistor. The collector is relatively high in resistivity as compared to the base 36. For this reason, during operation of the transistor a barrier or depletion region 51 develops and extends from the collector junction 49 largely into the collector region 38 so that the base width remains substantially constant. Thus, the collector depletion region 51 can be relatively wide to decrease the base-collector capacitance without adversely affecting the frequency response of the unit. The relatively large volume of the collector region and the large area of the collector contact 20 with the heat sink 19 dissipates heat generated at the collector junction effectively and enables the transistor to operate successfully at relatively high power levels. Since an entire face of the die unit 17 is mounted on tab 19, the unit is quite rugged mechanically despite the extreme thinness of the base 36. The positions of the collector junction 49 and the emitter junction 42 are both controlled from the same surface, thus making it possible to locate them accurately.

The cover member 26 is then placed over but spaced from the mounting header 10 (Step K of FIG. 3), and the units are placed in an oven under a partial vacuum and are subjected to a baking process at a temperature up to 350° C., preferably at 300° C. This high temperature vacuum baking has been found to be very beneficial in stabilizing the electrical properties of the transistor and is made possible by the fact that the metals and alloys in the unit have melting points above 350° C. The units are then transferred to a welding chamber, and the space within the welding chamber is filled with a protective gas consisting of 50% helium and 50% oxygen. The unit is sealed by welding the cover 26 to lip 27. Following electrical testing and inspection the unit is ready for shipment.

The present invention thus provides a diminutive transistor characterized by a high frequency response and reliability of performance. It is readily manufacturable despite its small size. The electrical properties, particularly the collector capacitance, are carefully controlled by accurate positioning of the channel which determines the area of the collector junction. The depth of the collector junction and also the alloyed emitter junction are controlled from the same side of the semiconductor die which enables their relative positions to be held within close tolerances. The method of making the transistor minimizes the dangers of contamination such as often takes place during conventional alloying operations. The melting temperatures of the materials and alloys are selected to permit high temperature baking of the final assembly to assure reliability. The high heat resistance of the materials and the effective heat dissipation provided by the large area collector and heat sink increases the power capabilities of the device. Of course, it will be understood that the invention may be applied to units involving somewhat different dimensions and methods involving somewhat different temperatures and times than those given for the embodiment described above.

I claim:

1. A high frequency transistor including in combination, a mounting header, a plurality of leads supported by said header providing emitter, base and collector connectors, a tab of molybdenum electrically connected to said collector lead, a die of germanium on said tab having a diffused layer of N-type conductivity and a substrate layer of P-type, conductivity with an interface between said layers, said substrate layer including a collector region and having material at a surface thereof fused to said tab cooperating therewith to provide a heat sink, said fused material including a region of gold and indium alloyed with said collector region forming a majority carrier collector contact, said die having an electrically isolated central area including a portion of said diffused layer providing an active base region and a portion of said interface providing an active collector junction of predetermined area substantially smaller than said fused surface of said substrate layer, a strip of aluminum on said isolated central area including a portion alloyed with said surface layer providing an emitter region of P-type conductivity and an emitter junction, a strip of gold and silver on said isolated central area spaced from said first strip and including a portion alloyed with said surface layer making ohmic contact with said base region, and a pair of contact wires connecting said strips respectively to said emitter and base leads.

2. A high frequency transistor including in combination, a mounting header, a plurality of leads supported by said header providing a ground connector and providing emiter, base, and collector connector posts projecting from said header, said leads being spaced equidistantly about a reference circle, said header including a conductive body connected to said ground connector and insulated from said emitter, base and collector posts, said conductive body surrounding each of said posts and extending therebetween for shielding the same to reduce interelectrode capacitance, a metal tab mounted rigidly on said collector connector post in cantilever relation with respect to said conductive body, a body of semiconductor material on said tab in a central position with respect to said leads, said body having a diffused layer of one conductivity type and a substrate layer of opposite conductivity type with an interface between said layers, and said body having a projecting central area including a portion of said diffused layer providing an active base region and a portion of said interface providing an active collector junction of predetermined area, said substrate layer providing a collector region and having a surface with an area larger than said predetermined area of said collector junction fused to said tab cooperating therewith to provide a heat sink of high capacity, said substrate layer further having a region of metal at said fused surface alloyed with said collector region forming a majority carrier collector contact, a first deposit of metal on said projection including a portion alloyed with said semiconductor body forming an emitter region of said opposite conductivity type and an emitter junction, a second deposit of metal on said projection spaced from said first deposit and making ohmic contact with said base region, and first and second contact wires respectively connecting said first and second deposits to said emitter and base connector posts.

3. A mounting header for a transistor including in combination, a conductive body having a mounting surface, insulating material supported by said conductive body, a plurality of electrical leads supported by said body providing respectively emitter, base, and collector connection posts above said mounting surface and further providing a ground connector lead, said leads being spaced equidistantly around said header along a reference circle and having portions projecting below said mounting surface for making external electrical connections, said posts being available above said mounting surface to facilitate making internal connections thereto, said conductive body being conductively connected to said ground connector lead and insulated by said insulating material from said emitter, base, and collector posts, said conductive body surrounding each of said posts and extending therebetween for shielding the same to reduce interelectrode capacitance in the transistor, and a metal tab connected to the end of said collector post for mounting a semiconductor unit thereon and providing a current and heat conduction path therefor, said tab extending inwardly from said collector post in cantilever fashion with respect to said conductive body to a position substantially centrally with respect to the array of said posts to receive the semiconductor unit adjacent the inner end thereof.

4. A transistor device including in combination, a mounting header having a conductive body and having four leads spaced circularly about said conductive body, insulating material electrically isolating three of said leads from said conductive body and from each other, with the fourth lead being electrically common with said conductive body and providing a ground lead, said leads having portions on one side of said header for making external electrical connections and at least said three of said leads projecting from the other side of said header forming upstanding connector posts to facilitate making internal connections thereto, said conductive body surrounding each of said posts and extending therebetween for shielding the same to reduce interelectrode capacitance in the transistor, a tab of metallic material mounted rigidly on the end of one of said posts and extending inwardly therefrom in cantilever fashion over said conductive body to a central position with respect to said leads, a semiconductor unit having a collector portion mounted on the inner end of said tab in a fused connection and having emitter and base contacts facing away from said conductive body, and contact wires connecting said emitter and base contacts respectively to two of said connector posts for providing internal emitter and base electrical connections.

5. A transistor including in combination, a body of semiconductor material having a diffused layer of one conductivity type and a substrate layer of opposite conductivity type forming a rectifying junction therebetween, said body having an outside peripheral edge and an endless channel formed in the body inwardly from said peripheral edge and extending through said diffused layer into said substrate layer and isolating a central portion of said diffused layer and a central portion of said rectifying junction to provide an active collector junction with an area which is predetermined and defined by said endless channel, said substrate layer providing a collector region with said collector junction on one side and having an area on the other side substantially larger than said predetermined area of said active collector junction, a rectifying emitter connection formed by material fused to said isolated central portion of said diffused layer, an ohmic base connection formed by material which is also fused to said isolated central portion of said diffused layer, and collector connection means on said substrate layer over the entire area of said other side and providing a path for removing heat from said body whose effectiveness is increased by the comparatively large area of said collector region and said collector connection means compared to that of said collector junction.

6. A transistor device including in combination, a mounting header having a conductive body and having four leads extending from one side thereof spaced circularly about said conductive body, insulating material electrically isolating three of said leads from said conductive body and from each other, with the fourth lead being electrically common with said conductive body and providing a ground lead, said leads being adapted to make external electrical connections from said device, with at least three of said leads projecting from the other side of said header forming upstanding connector posts to facilitate making internal connections thereto, a tab of metallic material mounted rigidly on the end of one of said posts and extending inwardly therefrom and at right angles to said post over said conductive body to a central position with respect to said three upstanding connectors posts, a semiconductor unit having a face portion on one side mounted at said face portion on the inner end of said tab in a fused connection and having two spaced apart contacts on the other side of said unit, and contact wires connecting said two spaced apart contacts respectively to two of said connector posts for providing internal electrical connections for said transistor device.

7. In a transistor having a header with a plurality of connector means extending therefrom, a semiconductor die unit mounted on one of said connector means and electrically connected thereto, said semiconductor die unit having a peripheral edge and including a diffused layer at one side thereof separated from a substrate layer by an interface layer, a central area at said one side separated from said peripheral edge by an endless channel spaced inwardly from said peripheral edge and of a depth to extend through said diffused layer and interface layer into said substrate and defining the area of a junction between the interface layer and diffused layer and isolated from the remaining portions of the diffused layer and interface layer which are outwardly of the channel in the semiconductor die unit, said central area having a pair of contact portions on the outside thereof, with a wire connection from each said contact portion to a corresponding connector means in the header.

8. In a transistor having a semiconductor unit with a mounting portion on one side and a plurality of contact portions on the other side thereof, header means for supporting said semiconductor unit and electrically connecting thereto including a conductive body with a mounting surface, a plurality of electrical connector means supported by said body, with one of said connector means electrically common to said conductive body and providing a ground connector lead, and with the remaining electrical connector means being insulated therefrom, said connector means which are insulated from said body being available above said mounting surface to facilitate making internal connections thereto, with one of said latter connector means having a portion extending inwardly over said mounting surface toward the central part of the conductive body and generally toward the other of said latter connector means for mounting the semiconductor unit thereon, with said semiconductor unit mounted on said connector means portion in a position substantially centrally with respect to the other of said latter connector means, and a wire connection from each of said other latter connector means to a corresponding contact portion on the semiconductor unit.

References Cited in the file of this patent

UNITED STATES PATENTS

| | | |
|---|---|---|
| 2,813,326 | Liebowitz | Nov. 19, 1957 |
| 2,836,878 | Shepard | June 3, 1958 |
| 2,903,630 | Cohen et al. | Sept. 8, 1958 |
| 2,905,873 | Ollendorf et al. | Sept. 22, 1959 |
| 2,945,286 | Dorendorf | July 19, 1960 |
| 3,028,663 | Iwersen et al. | Apr. 10, 1962 |